(12) United States Patent
Zheng et al.

(10) Patent No.: US 12,402,318 B2
(45) Date of Patent: Aug. 26, 2025

(54) METAL GATE STACKS FOR CMOS SCALING

(71) Applicant: Micron Technology, Inc., Boise, ID (US)

(72) Inventors: Pengyuan Zheng, Boise, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 517 days.

(21) Appl. No.: 17/878,236

(22) Filed: Aug. 1, 2022

(65) Prior Publication Data
US 2024/0040790 A1    Feb. 1, 2024

(51) Int. Cl.
*H10B 43/40*    (2023.01)
*H10B 41/27*    (2023.01)
*H10B 41/40*    (2023.01)
*H10B 43/27*    (2023.01)

(52) U.S. Cl.
CPC ............. *H10B 43/40* (2023.02); *H10B 41/27* (2023.02); *H10B 41/40* (2023.02); *H10B 43/27* (2023.02)

(58) Field of Classification Search
CPC ........ H10B 43/40; H10B 41/27; H10B 41/40; H10B 43/27; H10B 41/41; H10B 41/50; H10B 43/50; H10B 41/20; H10B 41/35
See application file for complete search history.

(56) References Cited

U.S. PATENT DOCUMENTS

2021/0013221 A1*    1/2021    Daycock ................ H10B 41/10
2022/0093628 A1*    3/2022    Hosoda .................. H10B 41/27

\* cited by examiner

*Primary Examiner* — Shih Tsun A Chou
*Assistant Examiner* — Jonathan Keith Little
(74) *Attorney, Agent, or Firm* — Schwegman Lundberg & Woessner, P.A.

(57) ABSTRACT

A variety of applications can include apparatus having a memory device structured with an array of memory cells and a complementary metal-oxide-semiconductor (CMOS) device coupled to the array. The CMOS device can include a gate electrode on and contacting the polysilicon gates of a p-channel metal-oxide-semiconductor (PMOS) transistor and a n-channel metal-oxide-semiconductor (NMOS) transistor of the CMOS device, where the gate electrode is a multi-metal stack. The multi-metal stack of the gate electrode can be two levels of different metal compositions.

20 Claims, 7 Drawing Sheets

METAL GATE STACKS FOR CMOS SCALING

FIELD OF THE DISCLOSURE

Embodiments of the disclosure relate generally to electronic devices and systems and, more specifically, to memory devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), and synchronous dynamic random-access memory (SDRAM) among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line. Memory arrays of flash memory devices are being designed as 3D structures to increase memory density. For continued increases in memory capacity, various design considerations should be implemented for enhancements to reduce circuit area or limit increases of circuit area in memory die.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

The 3D memory array of memory devices can extend in a horizontal plane along a substrate, which can be designated as a x-y plane, and in a vertical direction, taken as the z direction perpendicular to the x-y plane. Other design considerations can be implemented with the 3D memory arrays such as using a circuit-under-array (CuA) architecture to enhance reduction of die size or increase utilization of space in a die. CuA refers generally to circuitry located in a memory die under a memory array of the memory die. The CuA can include control logic and sensing circuitry for sensing the programmed data states of memory cells of the memory array. With the control logic and sensing circuitry fabricated below the memory array, using semiconductor processing that can include complementary metal oxide semiconductor (CMOS) processing technology, CuA can be referred to as CMOS under array.

For a 3D NAND memory array, which can include vertical strings of memory cells, using floating gate transistors or charge trap transistors, and connections from data lines positioned above the 3D NAND, vertical connections extending through the 3D NAND memory array or through memory breaks within the 3D NAND memory array can be used to couple to sensing circuitry and other control logic of the CuA for the memory array. A CuA architecture, which allows for circuits that operate with a 3D memory array to be structured in a space in the substrate below the 3D memory array, provides capabilities for higher densities of memory cells. These capabilities address a desire to limit increases in the area (horizontal plane) of the memory die. For continued increases in memory capacity, other design considerations can be implemented that also provide for enhancements to operational speed of the memory device.

Various memory device formats can be structured in a CuA architecture, such as but not limited to NOR or NAND architecture semiconductor memory arrays. Both NOR and NAND flash architecture semiconductor memory arrays are accessed through decoders that activate specific memory cells by selecting the access line coupled to their gates. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows between the source line and the data line through each series-coupled group, restricted only by the selected memory cells of each group, placing current encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states). The sensing and control circuitry for such NOR or NAND architecture semiconductor memory arrays can be structured beneath the respective memory array in a CuA architecture.

In a CuA architecture for a memory die having a 3D memory array, the CuA region can include circuits for controlling the operation of the 3D memory array. One or more control circuits of the CuA can provide control signals to the 3D memory array in order to perform a read operation or a write operation on the 3D memory array. The CuA can include one or more of control circuitry, state machines, decoders, sense amplifiers, read/write circuits, and controllers. These circuits can implement one or more memory array operations including erasing, programming, or reading operations. For example, the CuA region can include an on-chip memory controller for determining row and column address, access line and data line addresses, memory array enable signals, and data latching signals. The operations on the 3D memory array are typically performed to access one or more memory cells in response to requests from other circuits on the memory die or a device external to the memory die. The CuA region can include pad structures to couple the memory array or one or more circuits in the CuA region to other portions of the die of the memory device, or to couple to devices external to the memory device.

In addition to architectures such as CUA architectures, to increase memory density, NAND memory design has been undergoing scaling. Such scaling can be conducted with respect to scaling of gates to memory cells in forming gates, for example, using replacement gate procedures. The scaling associated with the memory array of memory cells can provide for increased operational speed for the memory array. However, operational speed of the memory device is also a function of components of the memory device that operate in conjunction with the memory array. Such devices can include CMOS devices. The materials and structure of a CMOS device can determine the operating parameters of the CMOS device. In addition to operating parameters, selection of materials and structure for the CMOS device can depend on the conditions for processing the memory device. Such material selection can take into consideration temperature stability of the components of formed CMOS devices in further processing the memory device such as relatively high temperatures that may be associated with fabrication of the memory array.

The operational speed of a CMOS device can depend on resistance (R) and capacitance (C) associated with the CMOS device. This resistance and capacitance can lead to a RC delay that limits the CMOS speed. For example, a gate electrode to a CMOS device using 900 Å tungsten silicide ($WSi_X$) as gate metal can be too thick. Reducing the thickness of such a $WSi_X$ in a CMOS device in a memory device may be difficult or complex.

In various embodiments, a CMOS device can be structured in a memory device having a gate electrode structured as a multi-metal stack on and contacting polysilicon gates of the CMOS device. Material can be selected for the multi-metal stack of the gate electrode to have sheet resistance lower than a sheet resistance of $WSi_X$. The thickness of such a multi-metal stack gate electrode can be equal to or less than a thickness of a similar structure using $WSi_X$. The multi-metal stack for a CMOS device can be a bilayer stack on and contacting polysilicon gates of the CMOS device. A bilayer gate electrode of $TiN_X$ and $WN_Y$ can replace $WSi_X$ as a thickness scaling solution to reduce RC delay. For example, a bilayer gate electrode of $TiN_X$ and $WN_Y$ can be used to reduce a gate electrode thickness of a 900 Å $WSi_X$ to a gate electrode thickness of 300-450 Å of the $TiN_X$ and $WN_Y$ gate electrode. Other materials that meet sheet resistance and thermal stability can be selected for use in a multi-metal stack of the gate electrode of a CMOS device. The multi-metal stack can include two or more metallic compositions having a total thickness that meet specifications associated with RC delay for the CMOS device.

With the CMOS device formed before the memory array, for example in a CUA architecture, or during formation of the memory array, the material of the gate electrode should be thermally stable through the array cell formation. For example, the material for a multi-metal stack gate electrode can be selected to maintain thermal stability, at least to a level similar to using $WSi_X$ as a gate electrode, through anneals of diffusion materials in formation of memory cells.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., Internet-of-Things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 1:
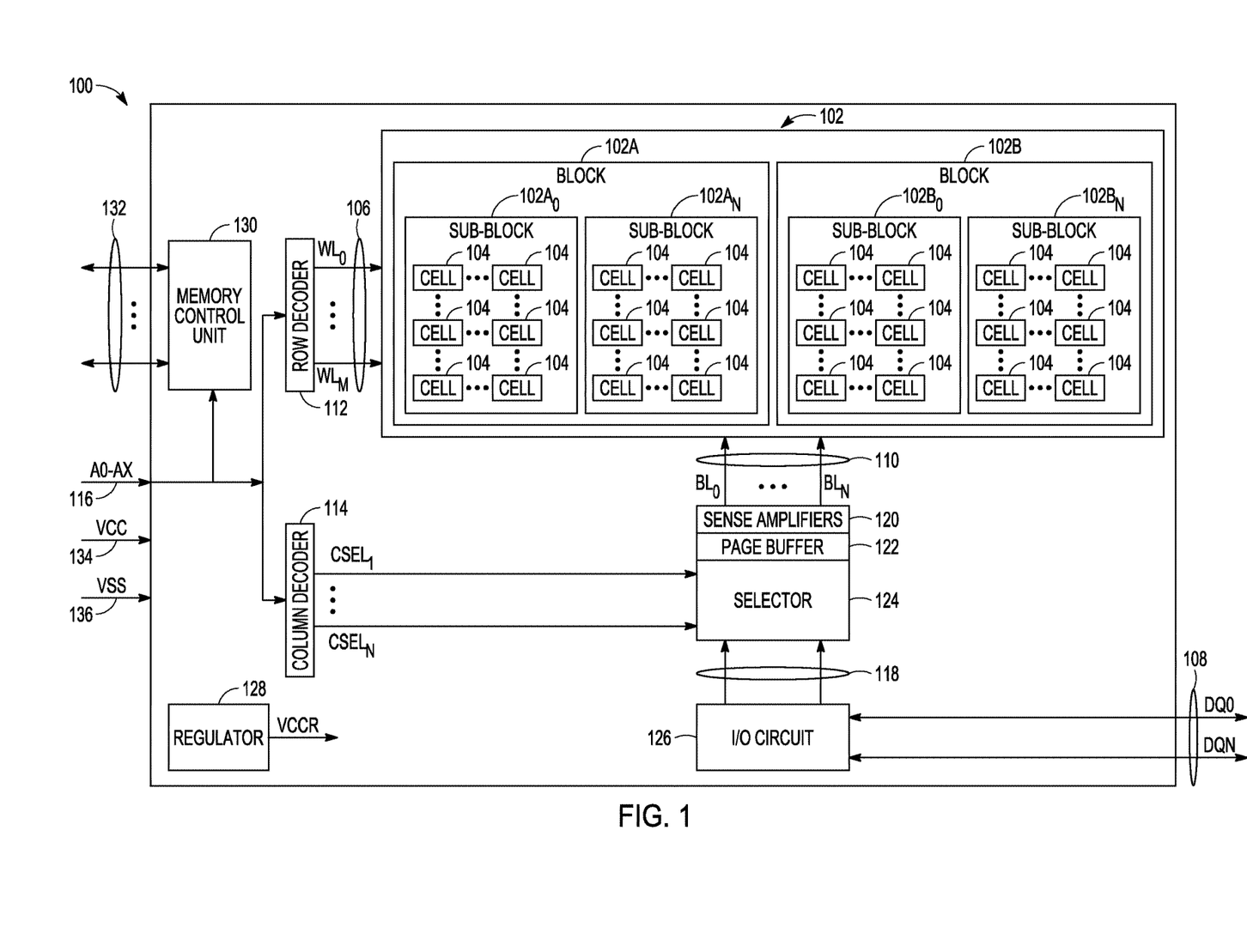
FIG. 1 illustrates a block diagram of an example memory device including a memory array and associated circuits, according to various embodiments.

FIG. 1 illustrates a block diagram of various components of an embodiment of an example memory device 100 including a memory array 102 and associated circuits. Example memory device 100 includes a plurality of memory cells 104, and one or more circuits or components to provide communication with, or perform one or more memory operations on, the memory array 102. The memory device 100 can include a row decoder 112, a column decoder 114, sense amplifiers 120, a page buffer 122, a selector 124, an I/O circuit 126, and a memory control unit 130. In various embodiments, the memory device 100 can be structured with a CuA architecture. Control circuitry for the memory array 102 can be located in a CuA region below the memory array 102 in the CuA architecture.

The memory cells 104 of the memory array 102 can be arranged in blocks, such as first and second blocks 102A, 102B. Each block can include sub-blocks. For example, the first block 102A can include first and second sub-blocks $102A_0$, $102A_n$, and the second block 102B can include first and second sub-blocks $102B_0$, $102B_n$. Each sub-block can include a number of physical pages, with each page including a number of memory cells 104. Although illustrated herein as having two blocks, with each block having two sub-blocks, and each sub-block having a number of memory cells 104, in other examples, the memory array 102 can include more or fewer blocks, sub-blocks, memory cells, etc. In other examples, the memory cells 104 can be arranged in a number of rows, columns, pages, sub-blocks, blocks, etc., and accessed using, for example, access lines 106, first data lines 110, or one or more select gates, source lines, etc.

The memory control unit 130 can control memory operations of the memory device 100 according to one or more signals or instructions received on control lines 132, including, for example, one or more clock signals or control signals that indicate a desired operation (e.g., write, read, erase, etc.), or address signals (A0-AX) received on one or more address lines 116. One or more devices external to the memory device 100 can control the values of the control signals on the control lines 132 or the address signals on the address lines 116. Examples of devices external to the memory device 100 can include, but are not limited to, a host, a memory controller, a processor, or one or more circuits or components not illustrated in FIG. 1.

The memory device 100 can use access lines 106 and first data lines 110 to transfer data to (e.g., write or erase) or from (e.g., read) one or more of the memory cells 104. The row decoder 112 and the column decoder 114 can receive and decode the address signals (A0-AX) from the address lines 116, can determine which of the memory cells 104 are to be accessed, and can provide signals to one or more of the access lines 106 (e.g., one or more of a plurality of access lines (WL0-WLm)) or the first data lines 110 (e.g., one or more of a plurality of data lines (BL0-BLn)), such as described above.

The memory device 100 can include sense circuitry, such as the sense amplifiers 120, configured to determine the values of data on (e.g., read), or to determine the values of data to be written to, the memory cells 104 using the first data lines 110. For example, in a selected string of memory cells 104, one or more of the sense amplifiers 120 can read a logic level in the selected memory cell 104 in response to a read current flowing in the memory array 102 through the selected string to the first data lines 110. Sense amplifiers 120 can include CMOS devices having multi-metal stack gate electrodes.

One or more devices external to the memory device 100 can communicate with the memory device 100 using the I/O lines (DQ0-DQN) 108, address lines 116 (A0-AX), or control lines 132. The I/O circuit 126 can transfer values of data in or out of the memory device 100, such as in or out of the page buffer 122 or the memory array 102, using the I/O lines 108, according to, for example, the control lines 132 and address lines 116. The page buffer 122 can store data received from the one or more devices external to the memory device 100 before the data is programmed into relevant portions of the memory array 102, or can store data read from the memory array 102 before the data is transmitted to the one or more devices external to the memory device 100.

The column decoder 114 can receive and decode address signals (A0-AX) into one or more column select signals (CSEL1-CSELn). The selector 124 (e.g., a select circuit) can receive the column select signals (CSEL1-CSELn) and select data in the page buffer 122 representing values of data to be read from or to be programmed into memory cells 104. Selected data can be transferred between the page buffer 122 and the I/O circuit 126 using second data lines 118. The memory control unit 130 can receive positive and negative supply signals, such as a supply voltage (VCCx) 134 and a negative supply (VSS) 136 (e.g., a ground potential), from an external source or supply (e.g., an internal or external battery, an AC-to-DC converter, etc.). In certain examples, the memory control unit 130 can include a regulator 128 to internally provide positive or negative supply signals.

Figure 2:
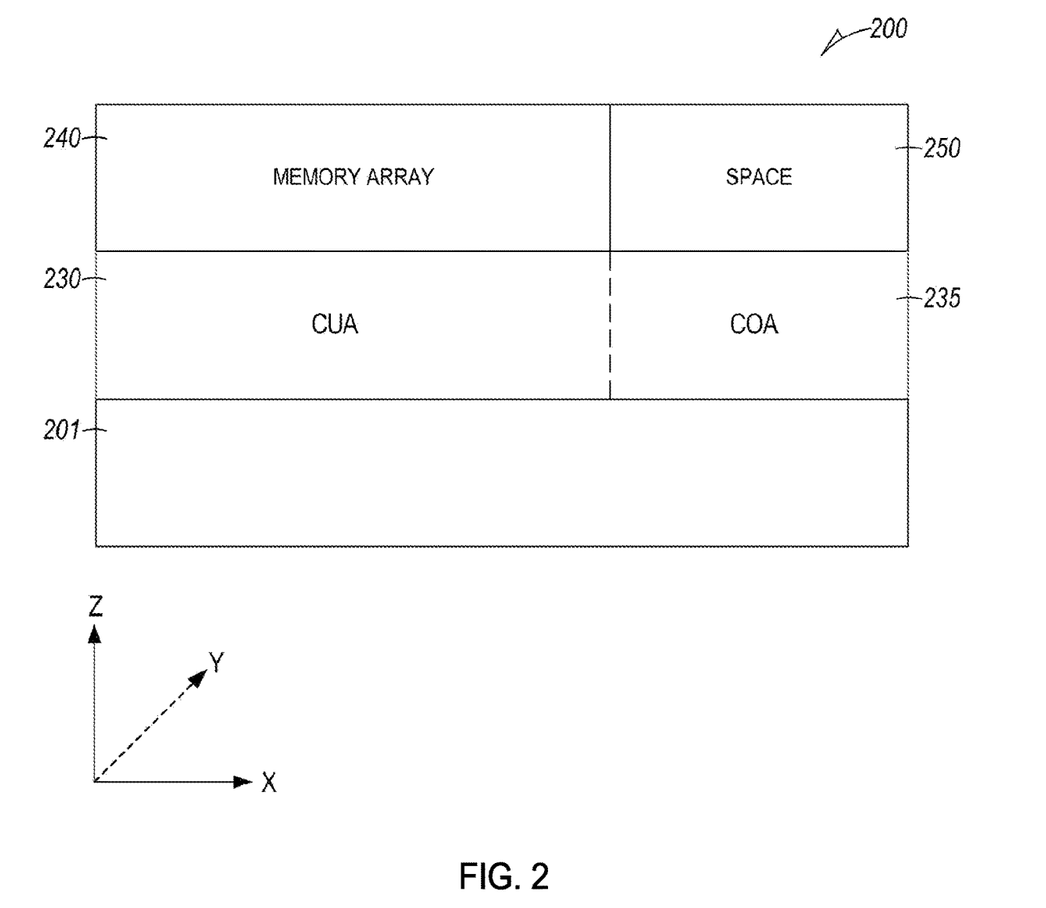
FIG. 2 is a block diagram of regions of an example memory device having a three-dimensional memory array in a circuit-under-array architecture, according to various embodiments.

FIG. 2 is a block diagram of regions of an embodiment of an example memory device 200 having a 3D memory array, in which the regions are shown in the z-x plane. A memory array region 240 having horizontal planes (x-y) of memory cells is disposed vertically over a CuA region 230 disposed in a substrate 201. The horizontal planes (x-y) of memory cells can be structured as multiple arranged tiers comprising memory cells. The CuA region 230 can include control circuitry for the memory array of the memory array region 240. The control circuitry in the CuA region 230 can include one or more instrumentalities similar to row decoder 112, column decoder 114, sense amplifiers 120, page buffer 122, selector 124, I/O circuit 126, and memory control unit 130 of memory device 100 shown in FIG. 1. A space 250 can be implemented adjacent the memory array region 240 and above the CuA region 230. The space 250 can be implemented beyond the horizontal extent of the memory array and may not directly contain elements of the control and sensing circuitry for the memory array, which can be located in the CuA region 230. The CuA region 230 can include a space of the CuA located directly below the 3D memory array of memory array region 240 such that this space of the CuA extends at least in one direction in the x-y plane to the same extent as the 3D memory array extends in this direction. The CuA region 230 can include a region in the die outside of the horizontal extent of the 3D memory array, referred to as OA, and below a level of the 3D memory array.

In various embodiments, circuits or contacts can be structured outside the horizontal extent of and below a level of the 3D memory array. The circuits in this OA region can be referred to as circuits-outside-array, CoA, in a CoA region 235. The space of the CoA can be disposed adjacent the portion of the space of the CuA region 230 that contains control circuitry for the memory array of the memory array region 240 and below the level of the 3D memory array. In various embodiments, CMOS devices having multi-metal stack gate electrodes can be located in CuA region 230 or CoA region 235. In memory devices without a CuA architecture, CMOS devices having multi-metal stack gate electrodes can be located in a periphery to a memory array and coupled to the memory array. Such a periphery can be located similar to space 250.

With the memory device 200 having a CoA region 235 adjacent the CuA region 230 containing control circuitry for the memory array and placed below a level of the memory array in memory array region 240, the space 250 can be arranged directly over the CoA region 235. The CoA region 235 can include pads to couple to nodes for external connections or pins of the package for the memory device 200. The space 250 can also be implemented with conductive columns to couple to the top levels of the memory device 200.

Figure 3:
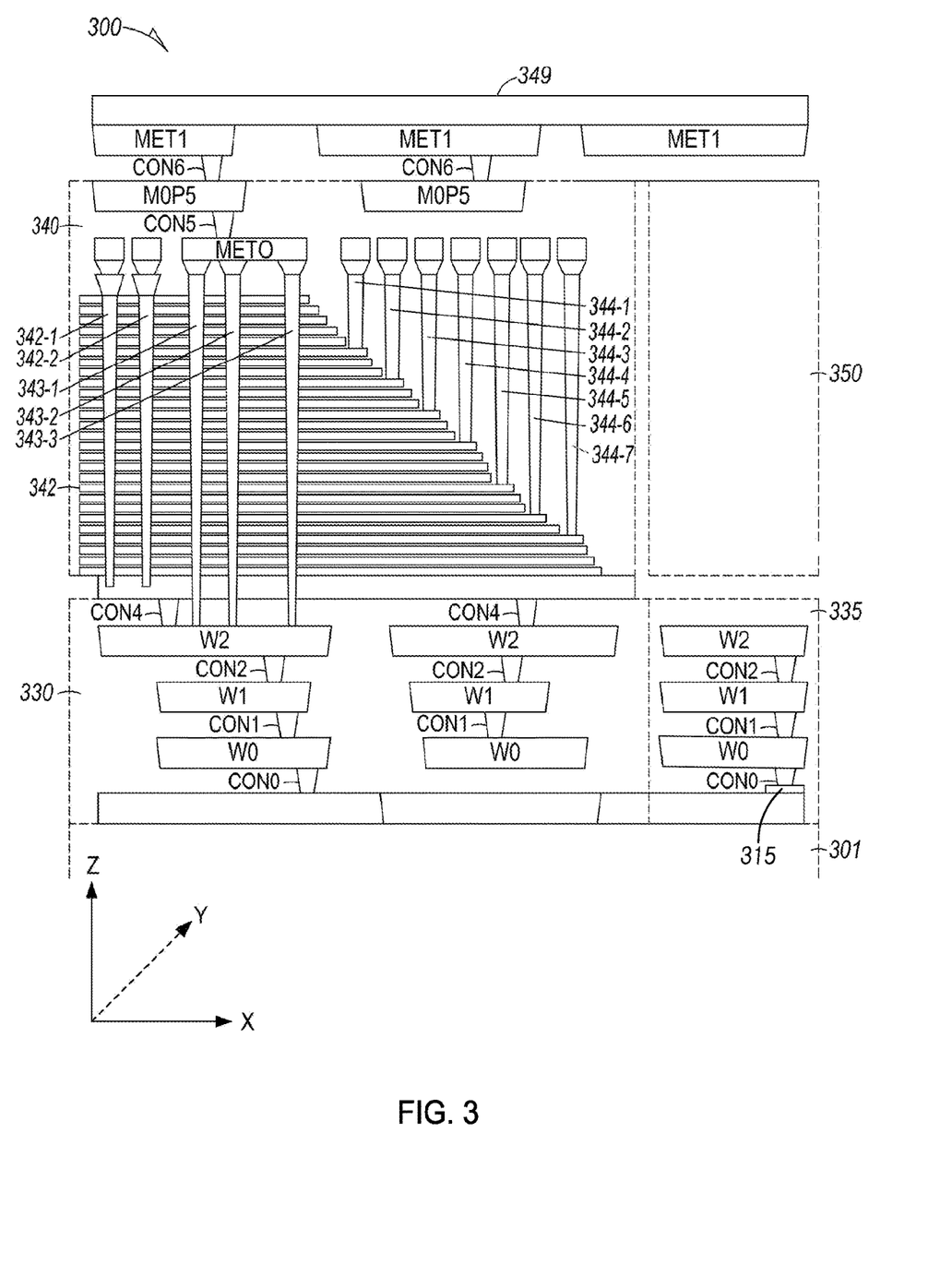
FIG. 3 is a representation of an example three-dimensional NAND memory device having a three-dimensional memory array with a circuit-under-array architecture, according to various embodiments.

FIG. 3 is a representation of an embodiment of an example 3D NAND memory device 300 having a 3D memory array, in which the regions are shown in a vertical cross-section in the z-x plane. A memory array region 340 having horizontal planes (x-y) of memory cells is disposed vertically over a CuA region 330 disposed in a substrate 301. The horizontal planes (x-y) of memory cells are structured as multiple arranged tiers 342 comprising memory cells. The CuA region 330 can include control circuitry for the memory array of the memory array region 340. The control circuitry can include one or more instrumentalities similar to row decoder 112, column decoder 114, sense amplifiers 120, page buffer 122, selector 124, I/O circuit 126, and memory control unit 130 of memory device 100 of FIG. 1 or other circuits to control access to selected memory cells of the tiers 342. A space 350, similar to the space 250 of FIG. 2, can be adjacent the memory array region 340 and above the CuA region 330. The 3D NAND memory device 300 can have a CoA region 335, as part of the CuA region 330, adjacent the section of the CuA region 330, where CuA region 330 contains the control circuitry and sensing of the memory array in memory array region 340, and below a level of the memory array in memory array region 340. The space 350 can be arranged directly over the CoA region 335. The CoA region 335 can include pads to couple to nodes for external connections or pins of the package for the memory device 300. The space 350 can also be implemented with conductive columns to couple to the top levels of the memory device 300.

FIG. 3 also illustrates some of the elements of a NAND memory device having a 3D memory array. For discussion purposes, a small number of structural elements are shown in FIG. 3. Memory cells of the tiers 342 can extend from pillars such as pillars 342-1 and 342-2. Though only two such pillars are shown, other such pillars are located with respect to the tiers 342. The 3D NAND memory device 300 can also include, but is not limited in number to, conductive contact vias 343-1, 343-2, and 343-3 along with conductive plugs 344-1 . . . 344-7. The pillars 342-1 and 342-2, the conductive contact vias 343-1, 343-2, and 343-3, and the conductive plugs 344-1 . . . 344-7 can extend above and below tiers 342 and can contact different metallization levels, which can be at various vertical locations in the structure of the 3D memory array of the memory array region 340, such that access to the memory cells in the tiers 342 can be attained by a device external to the 3D memory array. The pillars 342-1 and 342-2, the conductive contact vias 343-1, 343-2, and 343-3, and the conductive plugs 344-1 . . . 344-7, and other similar structures provide vertical connections extending through the 3D memory array or through memory breaks within the 3D memory array, which vertical connections can be used to couple to sensing circuitry and other control logic of the CuA region 330 for the 3D memory array.

As a non-limiting example, FIG. 3 shows two metal layers labelled W2, two metal layers labelled W1, and two metal layers labelled W0 in the CuA region 330, where these metal layers provide electrical connections with circuit elements in the CuA region 330. In some embodiments, metal layers may be replaced with conductively doped semiconductor material, such as but not limited to conductively doped polysilicon. Electrical connections between metal layers or conductive semiconductor layers at different vertical levels in the CuA region 330 can be provided by conductive contact vias labelled CON0, CON1, CON2, and CON4. Conductive contact CON0 can be structured to a metal electrode 315 to a CMOS device. Metal electrode 315 can include W. Similarly, the CoA region 335 can include metal layers labelled W2, W1, and W0 to provide electrical connections with circuit elements in the CoA region 335.

At the top of the memory region 340 are metal layers labelled MOPS, which metal layers can interface with another metallization layer labelled MET1. MET1 can be top metallizations for the die containing the 3D NAND memory device 300 and can be covered by a passivation layer 349. The passivation layer 349 is an electrically insulating layer and can include one or more materials such as, but not limited to, tetraethyl orthosilicate (TEOS) and an oxynitride. The oxynitride, for example, can include silicon oxynitride. The various MOPS layers can couple to various MET1 layers by different contact vias CON6 and can couple to the conductive contact vias 343-1, 343-2, and 343-3 in the memory array region 340.

The conductive contact vias 343-1, 343-2, and 343-3, which are conductive vias in the memory array region 340, can be long conductive vias, relative to the conductive contact vias CON0, CON1, CON2, CON4, CON5, and CON6. The conductive contact vias 343-1, 343-2, and 343-3 can couple to metal layers W2 in the CuA region 330. Other such relatively long structures such as the conductive contact vias 343-1, 343-2, and 343-3, which can be referred to as CON3 metal, can also terminate in a different metal layer MET0.

Figure 4:
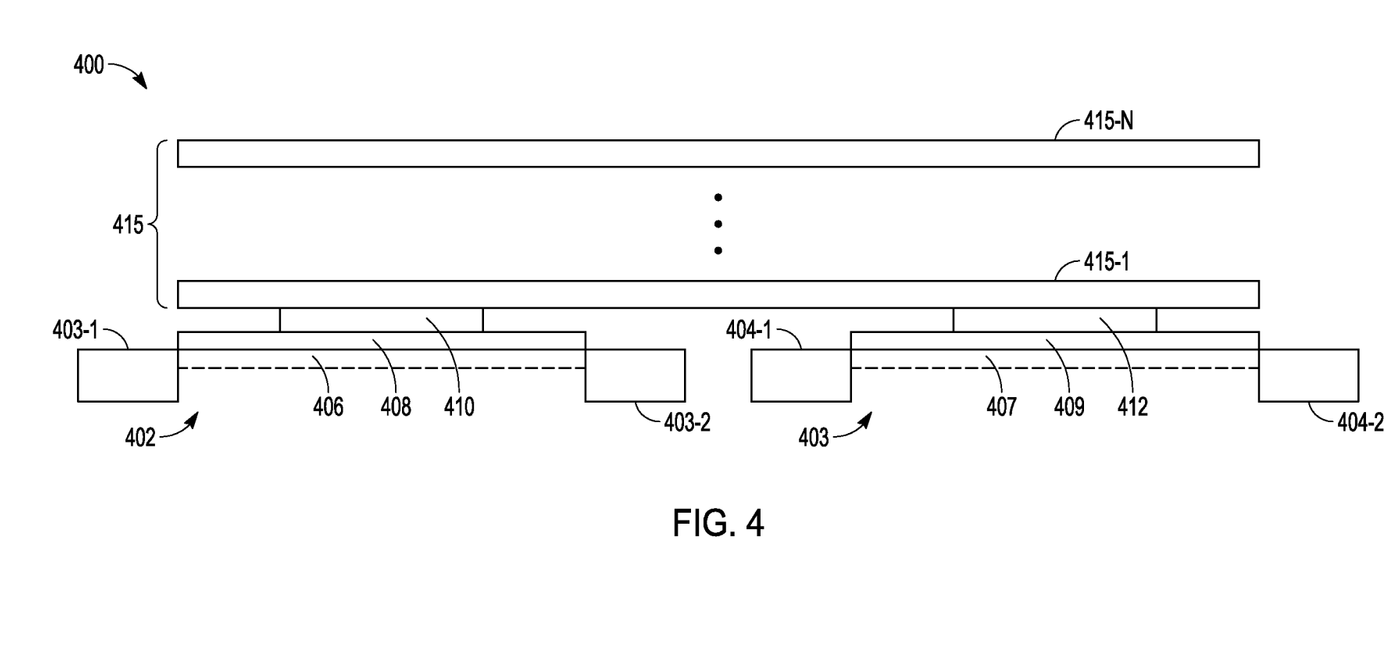
FIG. 4 is a representation of an example complementary metal oxide semiconductor device having a multi-metal gate electrode, according to various embodiments.

FIG. 4 is a representation of a CMOS device 400 having gate electrode 415 structured as a multi-metal stack. In various embodiments, gate electrode 415 can be implemented as gate electrode 315 of 3D NAND memory device 300 of FIG. 3, with CMOS device 400 located in CuA region 330 of 3D NAND memory device 300. Gate electrode 415 can be structured on and contacting a polysilicon gate 410 of a NMOS transistor 402 of CMOS device 400 and on and contacting a polysilicon gate 412 of a PMOS transistor 403 of CMOS device 400. In NMOS transistor 402, polysilicon gate 410 is separated from a channel structure 406 by a gate dielectric 408. Channel structure 406 can be arranged between a source region 403-1 and a drain region 403-2. Gate dielectric 408 can be a silicon oxide region or other appropriate dielectric for operation of CMOS device 400 in a memory device. In PMOS transistor 403, polysilicon gate 412 is separated from a channel structure 407 by a gate dielectric 409. Channel structure 407 can be arranged between a source region 404-1 and a drain region 404-2. Gate dielectric 409 can be a silicon oxide region or other appropriate dielectric for operation of CMOS device 400 in a memory device.

Gate electrode 415 can include metallic regions 415-1 . . . 415-N, where adjacent metallic regions have different metallic compositions. A metallic composition is a metal or a composition of two or more elements such that the composition has electrical properties of a metal. A metallic composition can be structured having one or more metals and one or more non-metals. Gate electrode 415 can be structured as a bilayer gate having metallic regions 415-1 and 415-2 (N=2). Metallic regions 415-1 and 415-2 can be realized by a region of $TiN_X$ and a region of $WN_Y$. Gate electrode 415 can be structured with $TiN_X$ as metallic region 415-1 on and contacting polysilicon gates 410 and 412 and $WN_Y$ as metallic region 415-2 on and contacting $TiN_X$ as metallic region 415-1. $TiN_X$ can be structured having a ratio of nitrogen to titanium ranging from one-tenth to one. $TiN_X$ can be structured as a titanium-rich $TiN_X$. $WN_Y$ can be structured having a ratio of nitrogen to tungsten ranging from zero to one. $WN_Y$ can become W on top of TiN after completing all annealing involved in forming an electronic device containing CMOS device 400. $WN_Y$ can become W on top of TiN after completing all annealing involved in forming an electronic device containing CMOS device 400. In some cases, $WN_Y$ can become $WN_Z$ where z is less than y after completing all annealing involved in forming the electronic device containing CMOS device 400. In these cases, not all N diffuses out from $WN_Y$ but a reduction of N in $WN_Y$ results. $TiN_X$ can have a nitrogen concentration different from the nitrogen concentration in $WN_Y$.

Metallic regions 415-1 and 415-2, structured as a region of $TiN_X$ and a region of $WN_Y$, can provide a gate electrode structure with thermal stability with respect to polysilicon gates 410 and 412. Gate electrode 415 can remain as a substantially consistent region on polysilicon gates 410 and 412. After processing of a memory device including CMOS device 400, a region of $TiN_X$ on a region of $WN_Y$ can remain as distinct layers.

Gate electrode 415 can have a thickness of one-half or less than a thickness of a region of tungsten silicide of a similar structure to operationally provide a RC delay in a memory device equal to or less than a RC delay provided by the tungsten silicide of the similar structure. Metallic region 415-1 of $TiN_X$ can have a thickness ranging from about 10 Å to about 200 Å and metallic region 415-2 of $WN_Y$ can have a thickness ranging from about 50 Å to about 350 Å. With metallic regions 415-1 and 415-2 composed of metallic compositions different from $TiN_X$ and $WN_Y$, these metallic regions can have the same thicknesses or thicknesses different from the thicknesses for $TiN_X$ and $WN_Y$.

FIG. 4 shows basic features of NMOS transistor 402 and PMOS transistor 403. NMOS transistor 402 and PMOS transistor 403 can be structured in a number of different designs, while continuing to have gate electrode 415 structured as a multi-metal stack. For instance, source region 403-1 and a drain region 403-2 of NMOS transistor 402 can be in a p-well in a n-type substrate with polysilicon gate 410 being a n+ region. In another design, source region 404-1 and a drain region 404-2 of PMOS transistor 403 can be in a n-well in a p-type substrate with polysilicon gate 412 being a p+ region. Design options can also include features such as, but not limited to, lightly doped drain (LDD) regions, halo regions, shallow trench isolations (STIs), and embedded silicon germanium (eSiGe) source/drain regions in PMOS transistor 403. A halo region is a doped region with implants to reduce a short channel effect. An eSiGe source/drain region provides a stressor for a PMOS transistor that can exert a compressive force on a channel of the PMOS transistor that increases the mobility of the holes due to the compressor stress and thereby improves the device performance.

Figure 5:
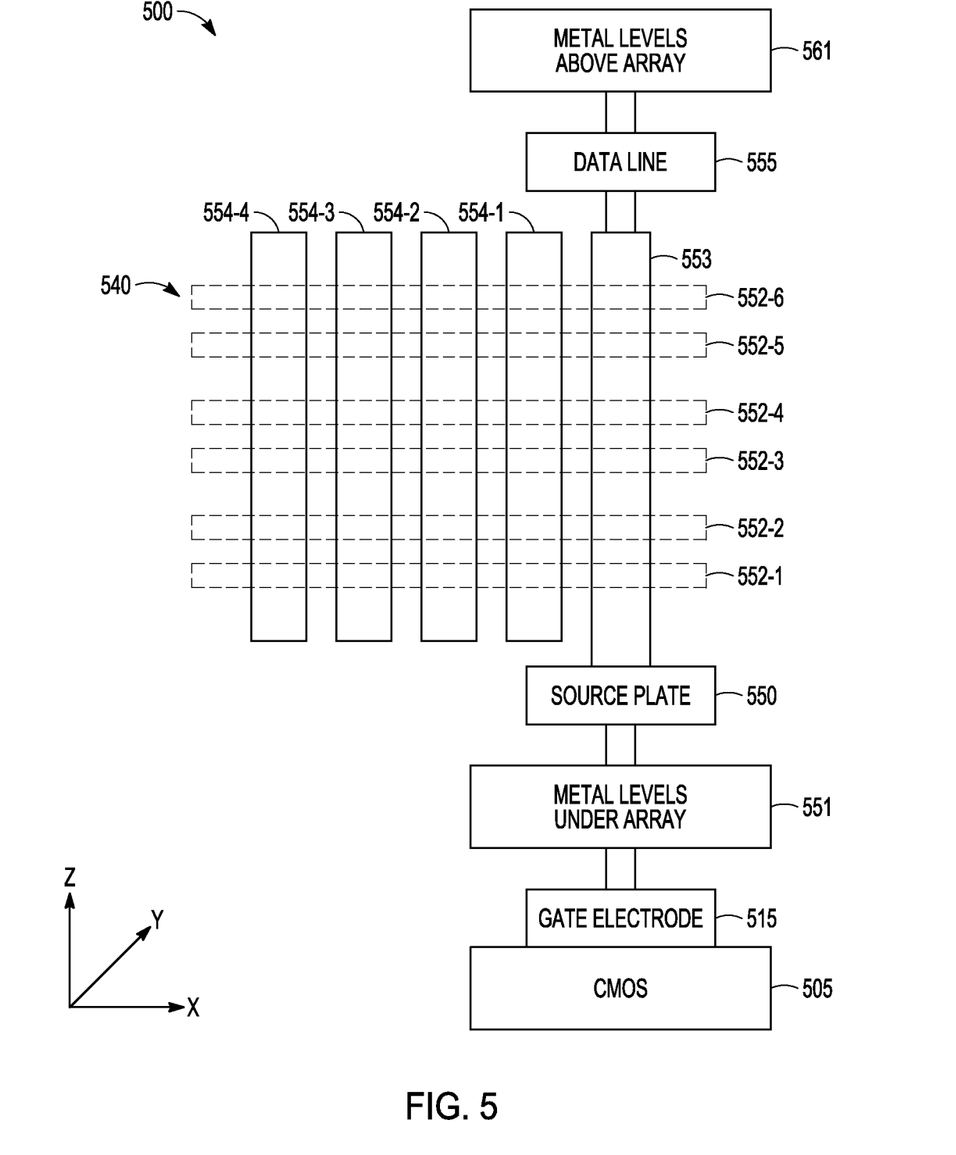
FIG. 5 is a representation of an example three-dimensional memory device, having a three-dimensional memory array coupled to a complementary metal oxide semiconductor device at a level below the three-dimensional memory array, according to various embodiments

FIG. 5 is a representation of an example 3D memory device 500, having a 3D memory array 540 coupled to a CMOS device 505 at a level below 3D memory array 540. Memory array 540 can include a number of strings of memory cells, such as strings 554-1, 554-2, 554-3, and 554-4, where the memory cells of a string can be located at an intersection of the string with an access line, such as one of access lines 552-1, 552-2, 552-3, 552-4, 552-5, and 552-6. Though there are 6 access lines and 4 strings of memory cells shown, memory device 500 can have more than 6 access lines and 4 strings of memory cells. The memory cells can be coupled to data lines and source lines, where a number of source lines can be configured as a source plate 550. A data line can be coupled to source plate 550 using a contact pillar, for example, but not limited to, a data line 555 coupled to a source plate 550 by a contact pillar 553.

Under memory array 540, metal levels under array 551 can couple source plate 550 to a metal electrode 515 of CMOS device 505. Metal electrode 515 can be structured similar to gate electrode 415 structured as a multi-metal stack for CMOS device 400 of FIG. 4. Metal levels above array 561 can be used to conduct signals from metal levels under array 551 to memory array 540. Memory device 500 can include a number of CMOS devices under memory array 540, for example, but not limited to, a CMOS device for each data line of memory device 500.

Figure 6:
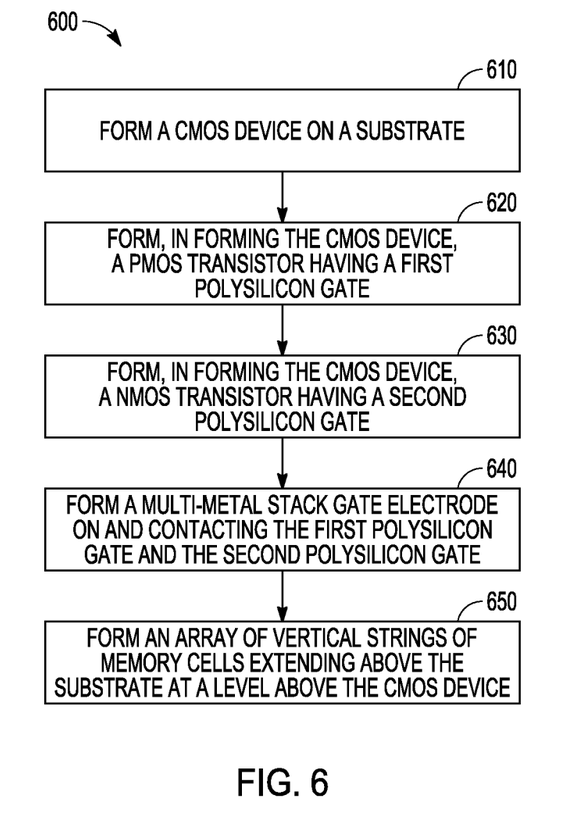
FIG. 6 is a flow diagram of features of an example method of forming a memory device, according to various embodiments.

FIG. 6 is a flow diagram of features of an embodiment of an example method 600 of forming a memory device. At 610, a CMOS device is formed on a substrate. The substrate can be a substrate appropriate for a silicon-based memory device. At 620, in forming the CMOS device, a PMOS transistor having a first polysilicon gate is formed. The first polysilicon gate is formed on a first gate dielectric. The first gate dielectric is disposed on a channel structure, where the channel structure is between a source region and a drain region for the PMOS transistor. At 630, in forming the CMOS device, a NMOS transistor having a second polysilicon gate is formed. The second polysilicon gate is formed on a second gate dielectric. The second gate dielectric is disposed on a channel structure, where the channel structure is between a source region and a drain region for the NMOS transistor.

At 640, a multi-metal stack gate electrode is formed on and contacting the first polysilicon gate and the second polysilicon gate. The multi-metal stack gate electrode can be formed as a bilayer gate electrode. The multi-metal stack gate electrode can be formed such that the multi-metal stack gate electrode has a sheet resistance lower than a sheet resistance of tungsten silicide. The multi-metal stack can be formed having a thickness equal to or less than 500 Å and having a temperature thermal stability, relative to being in contact with a polysilicon structure, equal to or greater than that of tungsten silicide being in contact with a polysilicon structure. Such a multi-metal stack can be maintained in a higher thermal treatment for annealing the array. At 650, an array of vertical strings of memory cells is formed extending above the substrate at a level above the CMOS device.

Variations of method 600 or methods similar to method 600 can include a number of different embodiments that may be combined depending on the application of such methods and/or the architecture of memory devices for which such methods are implemented. Such methods can include forming the multi-metal stack gate electrode by forming a region of titanium nitride on and contacting the first polysilicon gate and the second polysilicon gate and forming a region of tungsten nitride on and contacting the region of titanium nitride. Forming the region of titanium nitride can include forming the titanium nitride having a thickness ranging from about 10 Å to about 200 Å. Forming the region of tungsten nitride can include forming the tungsten nitride having a thickness ranging from about 50 Å to about 350 Å.

Variations of method 600 or methods similar to method 600 can include forming titanium nitride by forming titanium-rich titanium nitride as a region of the multi-metal stack gate electrode of the CMOS device. Variations can include forming the tungsten nitride by forming the tungsten nitride with a ratio of nitrogen to tungsten ranging from zero to one. Various deposition techniques can be used in forming metal regions, such as a titanium nitride region, for the multi-metal stack gate electrode, for example, by forming the titanium nitride region by a physical vapor deposition (PVD) process. Other procedures for forming the titanium nitride region can include, but are not limited to, chemical vapor deposition (CVD) and atomic layer deposition (ALD).

Variations of method 600 or methods similar to method 600 of forming the memory device can include forming the array of memory cells of the memory device at different locations in the memory device, with the array coupled to the CMOS device. The array of memory cells can be formed directly above the CMOS device. The array of memory cells can be formed at a level above the CMOS device shifted horizontally with respect to the CMOS device. With the array of memory cells shifted with respect to the CMOS device, metal paths coupled to the array, directly below the array, can be run horizontally below the bottom level of the array to couple to the CMOS device.

In various embodiments, a memory device can comprise an array of vertical strings of memory cells and a CMOS device coupled to the array. The array can extend above a substrate, and the CMOS device can be located at a level below the array on the substrate. The CMOS device can include a PMOS transistor having a first polysilicon gate on a first gate dielectric and a NMOS transistor having a second polysilicon gate on a second gate dielectric. A gate electrode can be structured on and contacting the first polysilicon gate and the second polysilicon gate, where the gate electrode is a multi-metal stack. The gate electrode can have a sheet resistance lower than a sheet resistance of tungsten silicide arranged as a single metal composition for a gate electrode in a similar structure. The gate electrode, structured as a multi-metal stack, can have a thickness equal to or less than 500 Å and have a temperature thermal stability, relative to being in contact with a poly silicon structure, equal to or greater than that of tungsten silicide in contact with a poly silicon structure.

Variations of such a memory device and its features, as taught herein, can include a number of different embodiments and features that may be combined depending on the application of such memory devices, the format of such memory devices, and/or the architecture in which such memory devices are implemented. Features of such memory devices can include the gate electrode of the CMOS device, structured as a multi-metal stack, being a bilayer metal structure. At least one layer of the bilayer metal structure can include a conductive compound having a metal and at least one other element. The CMOS device can be located directly under the array.

In various embodiments, a memory device can comprise an array of vertical strings of memory cells and a CMOS device coupled to the array. The array can extend above a substrate; and the CMOS device can be located at a level below the array on the substrate. The CMOS device can include a PMOS transistor having a first polysilicon gate on a first gate dielectric and a NMOS transistor having a second polysilicon gate on a second gate dielectric. A gate electrode can be structured on and contacting the first polysilicon gate and the second polysilicon gate, where the gate electrode is a multi-metal stack. The gate electrode can be structured as a multi-metal stack having a region of titanium nitride and a region of tungsten nitride or tungsten.

Variations of such a memory device and its features, as taught herein, can include a number of different embodiments and features that may be combined depending on the application of such memory devices, the format of such memory devices, and/or the architecture in which such memory devices are implemented. Features of such memory devices can include the region of titanium nitride being on and contacting the first polysilicon and the second polysilicon and the region of tungsten nitride being on and contacting the region of titanium nitride. The gate electrode can have a thickness of one-half or less than a thickness of a region of tungsten silicide of a similar structure to operationally provide a resistance-capacitance (RC) delay equal to or less than a RC delay provided by the tungsten silicide of the similar structure.

Variations of such a memory device and its features can include the region of titanium nitride having a thickness ranging from about 10 Å to about 200 Å and the region of tungsten nitride having a thickness ranging from about 50 Å to about 350 Å. Variations of such a memory device can include the tungsten nitride having a ratio of nitrogen to tungsten ranging from zero to one. Variations of such a memory device can include the titanium nitride having a ratio of nitrogen to titanium in the titanium nitride ranging from one-tenth to one.

Figure 7:
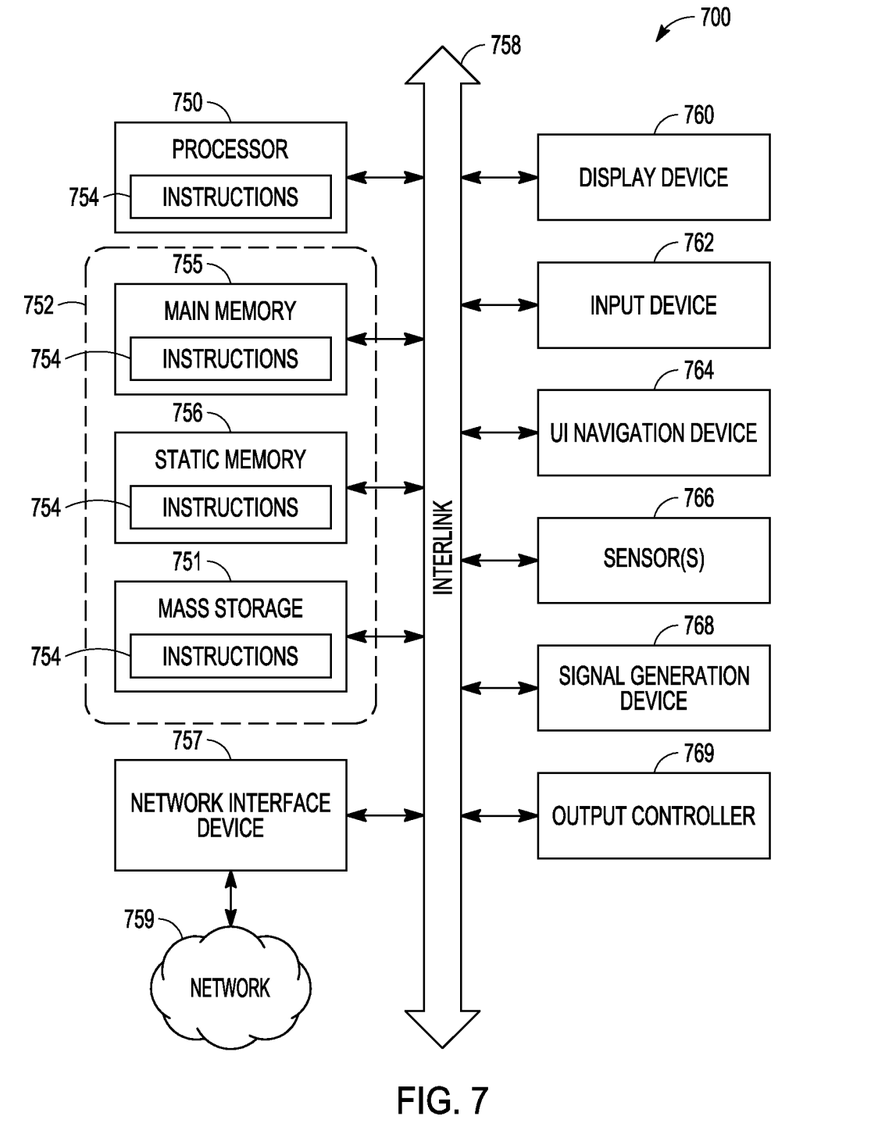
FIG. 7 is a block diagram illustrating an example of a machine in which one or more embodiments of memory devices may be implemented, according to various embodiments.

FIG. 7 illustrates a block diagram of an example machine 700 having one or more memory devices, where each of these memory devices includes a CMOS device coupled to a memory array of the memory device, with the CMOS device having a multi-metal stack gate electrode. Such memory devices can include a memory array extending over a substrate, with the memory array including multiple vertically arranged tiers comprising memory cells. Machine 700, having one or more such memory devices, may operate as a standalone machine or may be connected, for example networked, to other machines.

In a networked deployment, machine 700 may operate in the capacity of a server machine, a client machine, or both in server-client network environments. In an example, machine 700 may act as a peer machine in peer-to-peer (P2P) (or other distributed) network environment. Machine 700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more methodologies, such as cloud computing, software as a service (SaaS), or other computer cluster configurations. The example machine 700 can be arranged to operate with one or more memory devices having a CuA architecture such as but not limited to the example memory device 200 of FIG. 2, memory device 300 of FIG. 3, or memory device 500 of FIG. 5 with a CMOS device similar to CMOS device 400 of FIG. 4. The example machine 700 can include one or more memory devices functionally structured similar to memory device 100 of FIG. 1.

Examples, as described herein, may include, or may operate by logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 700 may include a hardware processor 750 (e.g., a CPU, a GPU, a hardware processor core, or any combination thereof), a main memory 755, and a static memory 756, some or all of which may communicate with each other via an interlink 758 (e.g., bus). Machine 700 may further include a display device 760, an input device 762, which can be an alphanumeric input device (e.g., a keyboard), and a user interface (UI) navigation device 764 (e.g., a mouse). In an example, display device 760, input device 762, and UI navigation device 764 may be a touch screen display. Machine 700 may additionally include a mass storage device (e.g., drive unit) 751, a network interface device 757, a signal generation device 768, and one or more sensors 766, such as a global positioning system (GPS) sensor, compass, accelerometer, or other sensor. Machine 700 may include an output controller 769, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 700 may include a machine-readable medium 752 on which is stored one or more sets of data structures or instructions 754 (e.g., software or microcode) embodying or utilized by machine 700 to perform any one or more of the techniques or functions for which machine 700 is designed.

The instructions 754 may also reside, completely or at least partially, within the main memory 755, within static memory 756, or within hardware processor 750 during execution thereof by machine 700. In an example, one or any combination of hardware processor 750, the main memory 755, the static memory 756, or the mass storage device 751 may constitute the machine-readable medium 752.

While machine-readable medium 752 is illustrated as a single medium, the term "machine-readable medium" may include a single medium or multiple media (e.g., a centralized or distributed database, or associated caches and servers) configured to store instructions 754. The term "machine-readable medium" may include any medium that is capable of storing instructions for execution by machine 700 and that cause machine 700 to perform any one or more of the techniques to which machine 700 is designed, or that is capable of storing data structures used by or associated with such instructions. Non-limiting machine-readable medium examples may include solid-state memories, optical media, and magnetic media. Specific examples of non-transitory machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

Instructions 754 (e.g., software, programs, an operating system (OS), etc.) or other data are stored on mass storage device 751, can be accessed by main memory 755 for use by hardware processor 750. Main memory 755 (e.g., DRAM) is typically fast, but volatile, and thus a different type of storage than mass storage device 751 (e.g., an SSD), which is suitable for long-term storage, including while in an "off" condition. Instructions 754 or data in use by a user or machine 700 are typically loaded in main memory 755 for use by hardware processor 750. When main memory 755 is full, virtual space from mass storage device 751 can be allocated to supplement main memory 755; however, because mass storage device 751 is typically slower than main memory 755, and write speeds are typically at least twice as slow as read speeds, use of virtual memory can greatly reduce user experience due to storage device latency (in contrast to main memory 755, e.g., DRAM). Further, use of mass storage device 751 for virtual memory can greatly reduce the usable lifespan of mass storage device 751.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 754 may further be transmitted or received over a network 759 using a transmission medium via signal generation device 768 or network interface device 757 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, signal generation device 768 or network interface device 757 may include one or more physical jacks (e.g., Ethernet, coaxial, or phone jacks) or one or more antennas to connect to network 759. In an example, signal generation device 768 or network interface device 757 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by machine 700 or data to or from machine 700, and includes instrumentalities to propagate digital or analog communications signals to facilitate communication of such instructions, which instructions may be implemented by software, or data.

The following are example embodiments of devices and methods, in accordance with the teachings herein.

An example memory device 1 can comprise an array of vertical strings of memory cells, the array extending above a substrate and a CMOS device coupled to the array. The CMOS device is located at a level below the array on the substrate, where the CMOS device includes: a PMOS transistor having a first polysilicon gate on a first gate dielectric, a NMOS transistor having a second polysilicon gate on a second gate dielectric, and a gate electrode on and contacting the first poly silicon gate and the second poly silicon gate, the gate electrode being a multi-metal stack.

An example memory device 2 can include features of example memory device 1 and can include the multi-metal stack having a sheet resistance lower than a sheet resistance of tungsten silicide.

An example memory device 3 can include features of example memory device 2 and any of the preceding example memory devices and can include the multi-metal stack having a thickness equal to or less than 500 Å and having a thermal stability, relative to being in contact with a poly silicon structure, equal to or greater than that of tungsten silicide such that the multi-metal stack is maintained in a higher thermal treatment for annealing the array.

An example memory device 4 can include features of any of the preceding example memory devices and can include the multi-metal stack being a bilayer metal structure.

An example memory device 5 can include features of example memory device 4 and any of the preceding example memory devices and can include at least one layer of the bilayer metal structure including a conductive compound having a metal and at least one other element.

An example memory device 6 can include features of any of the preceding example memory devices and can include the CMOS device being located directly under the array.

In an example memory device 7, any of the memory devices of example memory devices 1 to 6 may include memory devices incorporated into an electronic memory apparatus further comprising a host processor and a communication bus extending between the host processor and the memory device.

In an example memory device 8, any of the memory devices of example memory devices 1 to 7 may be modified to include any structure presented in another of example memory device 1 to 7.

In an example memory device 9, any of the memory devices of example memory devices 1 to 8 may be modified to include any structure presented in another of example memory device 1 to 8.

In an example memory device 10, any apparatus associated with the memory devices of example memory devices 1 to 9 may further include a machine-readable storage device configured to store instructions as a physical state, wherein the instructions may be used to perform one or more operations of the apparatus.

In an example memory device 11, any of the memory devices of example memory devices 1 to 10 may be operated in accordance with any of the methods of the below example methods 1 to 12.

An example memory device 12 can comprise an array of vertical strings of memory cells, the array extending above a substrate and a CMOS device coupled to the array. The CMOS device is located at a level below the array on the substrate, where the CMOS device includes a gate electrode on and contacting a first polysilicon gate of a PMOS transistor and on and contacting a second polysilicon gate of a NMOS transistor, the gate electrode being a multi-metal stack having a region of titanium nitride and a region of tungsten or tungsten nitride.

An example memory device 13 can include features of example memory device 12 and can include the region of titanium nitride being on and contacting the first polysilicon gate and the second polysilicon gate and the region of tungsten nitride being on and contacting the region of titanium nitride.

An example memory device 14 can include features of example memory device 13 and any of the preceding example memory device 12 and can include the gate electrode having a thickness of one-half or less than a thickness of a region of tungsten silicide of a similar structure to operationally provide a resistance-capacitance (RC) delay equal to or less than a RC delay provided by the tungsten silicide of the similar structure.

An example memory device 15 can include features of any of the preceding example memory devices 12 to 14 and can include the region of titanium nitride having a thickness ranging from about 10 Å to about 200 Å and the region of tungsten nitride having a thickness ranging from about 50 Å to about 350 Å.

An example memory device 16 can include features of any of the preceding example memory devices 12 to 15 and can include the tungsten nitride having a ratio of nitrogen to tungsten ranging from zero to one.

An example memory device 17 can include features of any of the preceding example memory devices 12 to 16 and can include the titanium nitride having a ratio of nitrogen to titanium in the titanium nitride ranging from one-tenth to one.

In an example memory device 18, any of the memory devices of example memory devices 12 to 17 may include memory devices incorporated into an electronic memory apparatus further comprising a host processor and a communication bus extending between the host processor and the memory device.

In an example memory device 19, any of the memory devices of example memory devices 12 to 18 may be modified to include any structure presented in another of example memory device 12 to 18.

In an example memory device 20, any apparatus associated with the memory devices of example memory devices 12 to 19 may further include a machine-readable storage device configured to store instructions as a physical state, wherein the instructions may be used to perform one or more operations of the apparatus.

In an example memory device 21, any of the memory devices of example memory devices 12 to 20 may be operated in accordance with any of the methods of the following example methods 1 to 12.

An example method 1 of forming a memory device, the method can comprise forming a CMOS device on a substrate and forming an array of vertical strings of memory cells extending above the substrate, coupled to the CMOS device, where the array is formed at a level above the CMOS device. Forming the CMOS device includes forming a PMOS transistor having a first polysilicon gate on a first gate dielectric; forming a NMOS transistor having a second polysilicon gate on a second gate dielectric; and forming a multi-metal stack gate electrode on and contacting the first polysilicon gate and the second polysilicon gate.

An example method 2 of forming a memory device can include features of example method 1 of forming a memory device and can include forming the multi-metal stack gate electrode to include forming a region of titanium nitride on and contacting the first polysilicon gate and the second polysilicon gate and forming a region of tungsten nitride on and contacting the region of titanium nitride.

An example method 3 of forming a memory device can include features of example method 2 of forming a memory device and any of the preceding example methods of forming a memory device and can include forming the region of titanium nitride to include forming the titanium nitride having a thickness ranging from about 10 Å to about 200 Å.

An example method 4 of forming a memory device can include features of example method 3 of forming a memory device and any of the preceding example methods of forming a memory device and can include forming the region of tungsten nitride to include forming the tungsten nitride having a thickness ranging from about 50 Å to about 350 Å.

An example method 5 of forming a memory device can include features of example method 2 of forming a memory device and of any of the preceding example methods of forming a memory device and can include forming the titanium nitride having a ratio of nitrogen to titanium in the titanium nitride ranging from one-tenth to one.

An example method 6 of forming a memory device can include features of example method 2 of forming a memory device and any of the preceding example methods of forming a memory device and can include forming the tungsten nitride to include forming the tungsten nitride with a ratio of nitrogen to tungsten ranging from zero to one.

An example method 7 of forming a memory device can include features of example method 2 of forming a memory device and features of any of the preceding example methods of forming a memory device and can include forming the titanium nitride, the tungsten, or the tungsten nitride by physical vapor deposition, chemical vapor deposition, or atomic layer deposition.

An example method 8 of forming a memory device can include features of any of the preceding example methods of forming a memory device and can include forming the array to include forming the array directly above the CMOS device.

In an example method 9 of forming a memory device, any of the example methods 1 to 8 of forming a memory device may be performed for forming an electronic memory apparatus further comprising forming a host processor and a communication bus extending between the host processor and the memory device.

In an example method 10 of forming a memory device, any of the example methods 1 to 9 of forming a memory device may be modified to include operations set forth in any other of method examples 1 to 9.

In an example method 11 of forming a memory device, any of the example methods 1 to 10 of forming a memory device may be implemented at least in part through use of instructions stored as a physical state in one or more machine-readable storage devices.

An example method 12 of forming a memory device can include features of any of the preceding example methods 1 to 11 of forming a memory device and can include forming the memory device to perform functions associated with any features of example memory devices 1 to 21.

An example machine-readable storage device 1 storing instructions, that when executed by one or more processors, cause a machine to perform operations associated with any features of example memory devices 1 to 21 or perform methods associated with any features of example methods 1 to 12.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A memory device comprising:
   an array of vertical strings of memory cells, the array extending above a substrate; and
   a complementary metal-oxide-semiconductor (CMOS) device coupled to the array, the CMOS device located at a level below the array on the substrate, the CMOS device including:
   a p-channel metal-oxide-semiconductor (PMOS) transistor having a first polysilicon gate on a first gate dielectric;
   a n-channel metal-oxide-semiconductor (NMOS) transistor having a second polysilicon gate on a second gate dielectric; and
   a gate electrode on and contacting the first polysilicon gate and the second polysilicon gate, the gate electrode being a multi-metal stack.

2. The memory device of claim 1, wherein the multi-metal stack has a sheet resistance lower than a sheet resistance of tungsten silicide.

3. The memory device of claim 2, wherein the multi-metal stack has a thickness equal to or less than 500 Å and has a thermal stability, relative to being in contact with a polysilicon structure, equal to or greater than thermal stability of the tungsten silicide such that the multi-metal stack is maintained in a higher thermal treatment for annealing the array.

4. The memory device of claim 1, wherein the multi-metal stack is a bilayer metal structure.

5. The memory device of claim 4, wherein at least one layer of the bilayer metal structure includes a conductive compound having a metal and at least one other element.

6. The memory device of claim 1, wherein the CMOS device is located directly under the array.

7. A memory device comprising:
an array of vertical strings of memory cells, the array extending above a substrate; and
a complementary metal-oxide-semiconductor (CMOS) device coupled to the array, the CMOS device located at a level below the array on the substrate, the CMOS device including a gate electrode on and contacting a first polysilicon gate of a p-channel metal-oxide-semiconductor (PMOS) transistor and on and contacting a second polysilicon gate of a n-channel metal-oxide-semiconductor (NMOS) transistor, the gate electrode being a multi-metal stack having a region of titanium nitride and a region of tungsten or tungsten nitride.

8. The memory device of claim 7, wherein the region of titanium nitride is on and contacting the first polysilicon gate and the second polysilicon gate and the region of tungsten nitride is on and contacting the region of titanium nitride.

9. The memory device of claim 8, wherein the gate electrode has a thickness of one-half or less than a thickness of a region of tungsten silicide of a similar structure to operationally provide a resistance-capacitance (RC) delay equal to or less than a RC delay provided by the region of tungsten silicide of the similar structure.

10. The memory device of claim 7, wherein the region of titanium nitride has a thickness ranging from about 10 Å to about 200 Å and the region of tungsten nitride has a thickness ranging from about 50 Å to about 350 Å.

11. The memory device of claim 7, wherein the region of tungsten or tungsten nitride has a ratio of nitrogen to tungsten ranging from zero to one.

12. The memory device of claim 7, wherein the region of titanium nitride has a ratio of nitrogen to titanium ranging from one-tenth to one.

13. A method of forming a memory device, the method comprising:
forming a complementary metal-oxide-semiconductor (CMOS) device on a substrate, including:
forming a p-channel metal-oxide-semiconductor (PMOS) transistor having a first polysilicon gate on a first gate dielectric;
forming a n-channel metal-oxide-semiconductor (NMOS) transistor having a second polysilicon gate on a second gate dielectric; and
forming a multi-metal stack gate electrode on and contacting the first polysilicon gate and the second polysilicon gate; and
forming an array of vertical strings of memory cells extending above the substrate, coupled to the CMOS device, the array formed at a level above the CMOS device.

14. The method of claim 13, wherein forming the multi-metal stack gate electrode includes forming a region of titanium nitride on and contacting the first polysilicon gate and the second polysilicon gate and forming a region of tungsten nitride or tungsten on and contacting the region of titanium nitride.

15. The method of claim 14, wherein forming the region of titanium nitride includes forming the titanium nitride having a thickness ranging from about 10 Å to about 200 Å.

16. The method of claim 15, wherein forming the region of tungsten nitride includes forming the tungsten nitride having a thickness ranging from about 50 Å to about 350 Å.

17. The method of claim 14, wherein forming the titanium nitride includes forming the titanium nitride having a ratio of nitrogen to titanium in the titanium nitride ranging from one-tenth to one.

18. The method of claim 14, wherein forming the tungsten nitride includes forming the tungsten nitride with a ratio of nitrogen to tungsten ranging from zero to one.

19. The method of claim 14, wherein the method includes forming the titanium nitride, the tungsten, or the tungsten nitride by physical vapor deposition, chemical vapor deposition, or atomic layer deposition.

20. The method of claim 13, wherein forming the array includes forming the array directly above the CMOS device.

* * * * *